United States Patent
Hoffman et al.

(10) Patent No.: US 6,847,927 B2
(45) Date of Patent: Jan. 25, 2005

(54) EFFICIENT ARRAY TRACING IN A LOGIC SIMULATOR MACHINE

(75) Inventors: Harrell Hoffman, Austin, TX (US); John Henry Westermann, Jr., Endicott, NY (US)

(73) Assignee: International Business Machines Corporation, Armonk, NY (US)

(*) Notice: Subject to any disclaimer, the term of this patent is extended or adjusted under 35 U.S.C. 154(b) by 647 days.

(21) Appl. No.: 09/732,266

(22) Filed: Dec. 7, 2000

(65) Prior Publication Data

US 2002/0072889 A1 Jun. 13, 2002

(51) Int. Cl.[7] .............................................. G06F 17/50
(52) U.S. Cl. ......................................... 703/14; 703/22
(58) Field of Search .............................. 703/14, 22, 21, 703/15, 19, 24; 710/21; 714/718

(56) References Cited

U.S. PATENT DOCUMENTS

| | | | | |
|---|---|---|---|---|
| 4,817,037 A | * | 3/1989 | Hoffman et al. ............ | 710/110 |
| 4,914,612 A | * | 4/1990 | Beece et al. ................. | 703/15 |
| 5,001,624 A | * | 3/1991 | Hoffman et al. ............ | 710/5 |
| 5,327,361 A | | 7/1994 | Long et al. ................. | 364/57 |
| 5,442,640 A | * | 8/1995 | Bardell et al. ............. | 714/718 |
| 5,548,785 A | * | 8/1996 | Fogg et al. .................. | 710/21 |
| 5,649,164 A | * | 7/1997 | Childs et al. ................ | 703/16 |
| 5,712,806 A | * | 1/1998 | Hennenhoefer et al. ..... | 716/16 |
| 5,802,303 A | * | 9/1998 | Yamaguchi ................. | 709/224 |
| 5,999,725 A | * | 12/1999 | Barbier et al. .............. | 703/28 |
| 6,321,184 B1 | * | 11/2001 | Baumgartner et al. ...... | 703/15 |

\* cited by examiner

*Primary Examiner*—Thai Phan
(74) *Attorney, Agent, or Firm*—Duke W. Yee; Robert M. Carwell; Wayne P. Bailey

(57) ABSTRACT

A method and system are described in a logic simulator machine for efficiently creating a trace of an array which includes a plurality of storage locations. The logic simulator machine executes a test routine. Prior to executing the test routine, an initial copy of all data included within each of the storage locations of the array is stored as a first trace of the array. During execution of a first cycle the test routine, all of the write control inputs into the array are read to identify ones of the storage locations which were modified during the execution of the first cycle. A new trace of the array is generated which includes a copy of all of the data of the first trace. In addition, only those ones of the storage locations in the first trace which were modified during the first cycle are updated. A trace is thus generated by updating only those ones of the storage locations which were modified during execution of a cycle of the test routine.

6 Claims, 2 Drawing Sheets

EFFICIENT ARRAY TRACING IN A LOGIC SIMULATOR MACHINE

BACKGROUND OF THE INVENTION

1. Technical Field

The present invention relates in general to a logic simulator machine. More particularly, the present invention provides apparatus and methods in a logic simulator machine for efficiently tracing an array.

2. Description of Related Art

Logic circuits in computer systems and related products have become increasingly large and complex. As a result, the initial design and fabrication have become increasingly more lengthy and costly. Although many efforts are made to eliminate any errors, it is no longer feasible to test the design only after the circuit has been fabricated. Accordingly, in recent years there has been increasing effort in design verification using computer modeling of the logic circuits before the circuit is actually embodied in hardware. The errors being referred to here are those produced by the interaction of logic circuits which are assumed to be operating correctly as separate entities but which are producing poor or incorrect results when operating together.

Logic technologies such as very large scale integrated circuits provide significant improvements in cost, performance, and reliability. However, they have disadvantages in that their fault diagnosis is more difficult than previous technologies and their engineering rework cycles needed to correct faults in logic design are greatly lengthened. These disadvantages exact great economic penalties for design errors and omissions and place a great emphasis on the goal of completely verifying designs in advance of engineering models.

Simulation has become a central part of verification methodology for circuit design. Applications span a wide spectrum, from early specifications to explore different architectural possibilities to the final stages of manufacturing test generation and fault coverage evaluation. For a long time, computer programs for use on a general purpose computer have been known which simulate such logic circuits. In these systems, the software program is run on any suitable general purpose computer. A model of the logic design is created. Test software programs may then be developed and executed using the model to analyze the operation of the logic design. However, as the number of gates on a single chip have reached into the range of hundreds of thousands to millions, these purely software simulators have required excessive amounts of computer time.

One approach used to overcome the excessive resource problem for full system simulation has been to build a hardware model of the design, essentially by hand wiring circuit boards with discrete components. Once wired, the circuit very quickly can emulate the desired circuit. A hardware emulator is a device which physically takes the place of the device to be emulated. A logic simulator machine, described below, could also act as a hardware emulator when the logic simulator machine is executing a model of the design if the appropriate wiring is attached to the logic simulator machine which will permit it to be physically coupled to other devices. However, a hardware model itself is costly and time consuming to build.

Another approach, which has found widespread acceptance, is a specialized logic simulator machine. These logic simulator machines as also sometimes called hardware accelerators. There are numerous logic simulation machines in existence for simulation, with different capacity, performance, and applications. These logic simulation machines range from small systems to significantly larger machines for simulating millions of gates. The term "logic simulator machine" as used herein will mean a hardware-based machine, and not a software-based simulation engine as described above.

One such logic simulator machine is described by U.S. Pat. No. 4,306,286 issued Dec. 15, 1981 to Cocke et al. This patent is herein incorporated by reference. The purpose of the logic simulator machine is to detect design errors in a simulated logic and enable the logic designer to correct the errors before the manufacture of the design.

The logic simulator machine described by Cocke et al. comprises a plurality of parallel basic processors which are interconnected through an inter-processor switch. The inter-processor switch provides communication not only among the basic processors which are the computing engine of the logic simulator machine, each simulating the individual gates of a portion of a logic model in parallel, but also between them and a control processor which provides overall control and input/output facilities of the logic simulator machine through a host computer to which the control processor is attached. Each basic processor contains the current state information for only the set of gates that is being simulated by that processor. When a basic processor simulates a gate whose input includes a connection to the output of a gate being simulated by a different processor, the state information for the gate is transferred over the inter-processor switch.

A representation of a logic design is first created in which Boolean gates, such as AND or OR gates, are used. A model of this representation is then built which may then be executed by the logic simulator machine. Test routines to test the design then may be executed using the model of the design which is being executed by the logic simulator machine.

In order to test a circuit design using a logic simulator machine, a model of the circuit is built. A test routine then may be executed using the model being executed by the logic simulator machine.

A trace is a record of what has happened to the device being traced during each cycle of the simulation. Individual nets and/or arrays may be traced. The trace captures the values of the nets or arrays on a cycle by cycle basis.

Tracing an individual net is obviously much easier than tracing an array. For each cycle, the value of an individual net must be obtained and written to a trace file. For an array, the number of values to be obtained and stored can be very large. This problem is even greater when more than one array needs to be traced.

Therefore, a need exists for a method and system for efficient array tracing in a logic simulator machine.

SUMMARY OF THE INVENTION

A method and system are described in a logic simulator machine for efficiently creating a trace of an array which includes a plurality of storage locations. The logic simulator machine executes a test routine. Prior to executing the test routine, an initial copy of all data included within each of the storage locations of the array is stored as a first trace of the array. During execution of a first cycle the test routine, all of the write control inputs into the array are read to identify ones of the storage locations which were modified during the execution of the first cycle. A new trace of the array is generated which includes a copy of all of the data of the first trace. In addition, only those ones of the storage locations in the first trace which were modified during the first cycle are updated. A trace is thus generated by updating only those ones of the storage locations which were modified during execution of a cycle of the test routine.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

A preferred embodiment of the present invention and its advantages are better understood by referring to FIGS. 1–5 of the drawings, like numerals being used for like and corresponding parts of the accompanying drawings.

The present invention is a method and system in a logic simulator machine executing a test routine for efficiently generating a trace of an array. The present invention provides for generating a trace using the inputs into the array instead of reading all of the array nets.

An initial state of the array is first obtained and stored as a first trace. The initial state is obtained by reading the output nets of the array. Thereafter, instead of reading output nets to generate a next trace, the write control inputs to the array are read during each cycle of the test routine.

After each cycle, a new trace of the array is generated. The data from the most recently generated trace will be copied to create the new trace. Next, locations of the array which were written to during the cycle are determined. If a location was written to, the location is examined to determine whether or not the data in the location was modified during the cycle. The new trace is then modified by modifying the data for only those locations which were modified during the cycle.

Therefore, the present invention provides a method and system for generating a trace after each cycle of a test routine by copying the data from the most recently obtained trace and updating only those locations within which data was modified during the cycle. The write control inputs to the array are read in order to determine which locations were written to and what the new data is. The data from the most recently stored trace is then compared to the data written to the storage locations during the execution of this cycle to determine whether the data stored in a location was modified.

Figure 1:
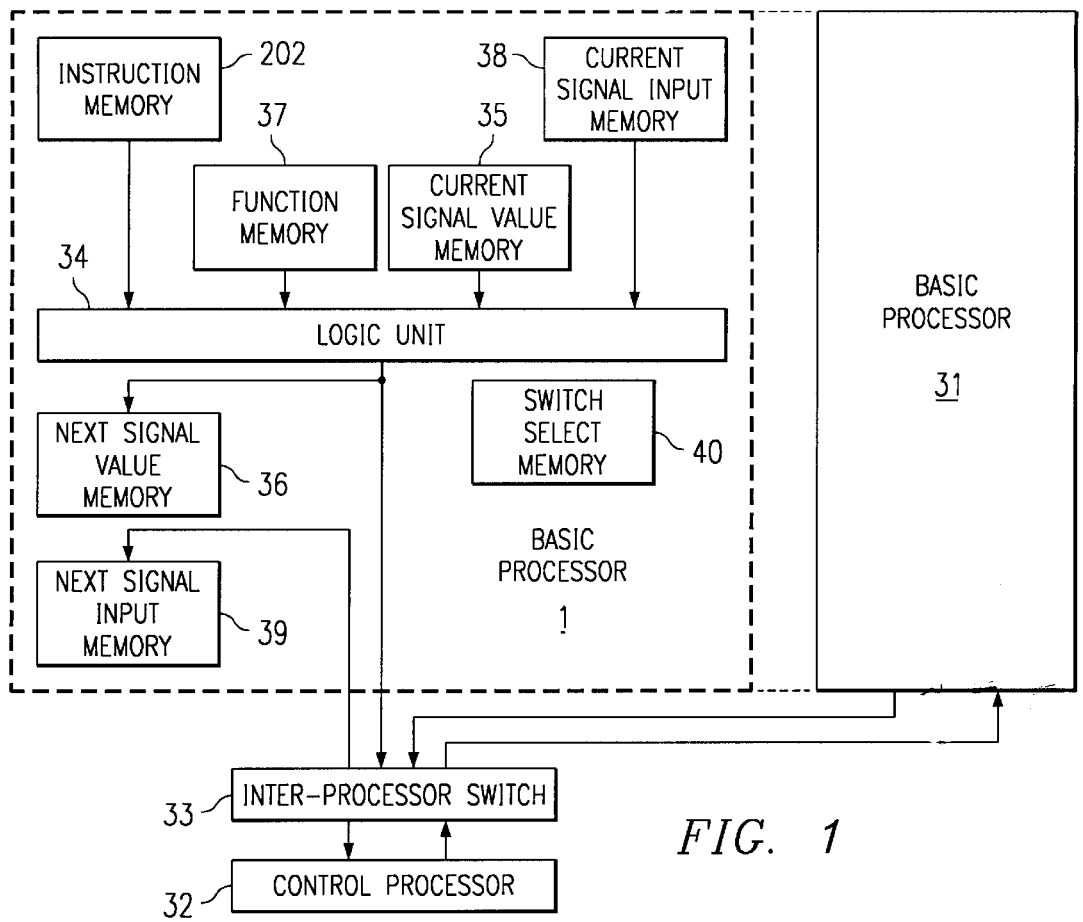
FIG. 1 depicts a logic simulator machine which is capable of executing the present invention.

As illustrated in FIG. 1, each basic processor such as processor 1 has a plurality of internal memories with a logic unit 34 connecting them. Two of these memories are two identical logic data memories which alternately assume one of two roles; that of the current signal value memory 35 and that of the next signal value memory 36. The current and next signal value memories 35 and 36 contain logic signal representations. The data in current signal value memory 35 are the logic signal values that are currently present in simulation. The logic unit updates those values, placing the results in the next signal value memory.

The process of updating all of the signal values is called a major cycle. The simulation proceeds in units of major cycles, each of which corresponds to a single gate delay. At the conclusion of each major cycle, the logic simulator machine may halt. If it does not, the former next signal value memory is designated to be the current signal value memory and another major cycle is performed.

Another component of the basic processor of FIG. 1 is the instruction memory 202. The logic unit 34 uses the instruction memory 202 in computing updated logic signal values.

Each logic simulator machine instruction contains a function code field, referred to as the opcode, and address fields. The function code specifies the logic function to be performed, e.g., AND, NOR, XOR, etc. The address fields specify input connections to a gate.

To perform a major cycle, the logic unit 34 sequences through instruction memory 202 in address order, executing each instruction by computing the specified logic function on the specified address fields from current signal memory. The result of each instruction is placed in next signal value memory 36 at the address equal to the instruction's address in instruction memory. Thus, an instruction (representing a gate) located at an address X has its result (representing the gate's output) placed at next signal value memory 36 address X. The gate's output one gate delay earlier resides at current signal value memory 35 address X.

The logic functions specified in the logic simulator machine instructions are defined by the contents of another basic processor memory, the function memory 37 shown in FIG. 1. Each distinct logic function used in a basic processor during a simulation is defined by the contents of a single location in function memory 37. The function code of each instruction is stored at an address in function memory 37.

Figure 2:
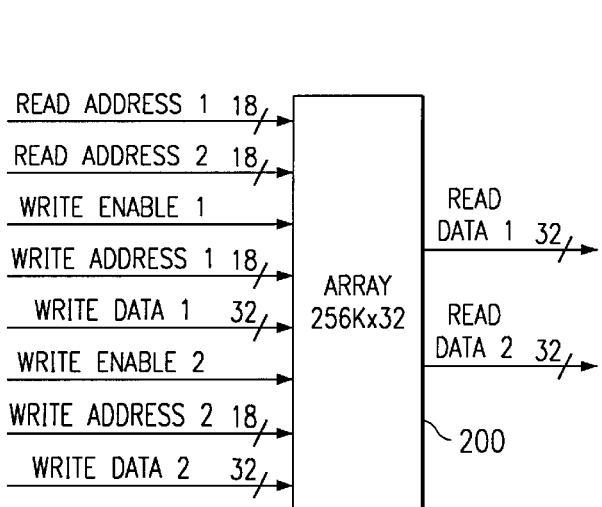
FIG. 2 illustrates a block diagram of an array in accordance with the present invention.

FIG. 2 illustrates a block diagram of an array 200 in accordance with the present invention. Array 200 includes a READ ADDRESS 1 input and a READ ADDRESS 2 input. Array 200 also includes write control inputs: WRITE ENABLE 1, WRITE ENABLE 2, WRITE ADDRESS 1, WRITE ADDRESS 2, WRITE DATA 1, and WRITE DATA 2. Array 200 includes a plurality of storage locations for storing data.

The data stored in array 200 may be modified when data is written into array 200. When data is written into array 200, a particular storage location within array 200 is specified using one of the WRITE ADDRESS inputs. The particular data to be written into array 200 is specified using one of the WRITE DATA inputs. Array 200 is then enabled to receive an input by setting the appropriate WRITE ENABLE input. Therefore, if an initial state of all of the data stored in array 200 is known, modified states of array 200 can be recreated by reading the write control inputs.

Figure 3:
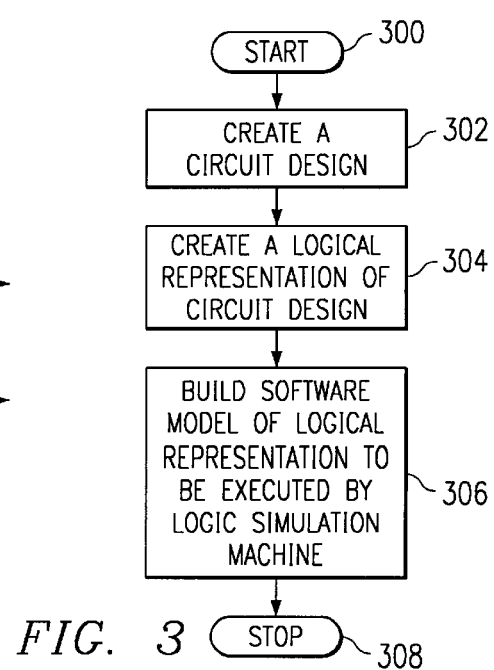
FIG. 3 depicts a high level flow chart which depicts building a model to use to execute a test routine utilizing a logic simulator machine in accordance with the present invention.

FIG. 3 depicts a high level flow chart which depicts building a model to use to execute a test routine utilizing a logic simulator machine in accordance with the present invention. The process starts as illustrated by block 300 and thereafter passes to block 302 which depicts creating a circuit design. This circuit design is to be tested using a logic simulator machine. Next, block 304 illustrates creating a logical representation of the circuit design. The process then passes to block 306 which depicts building a model of the logical representation. The test routine will be executed by the logic simulator machine using this model. The process then terminates as illustrated by block 308.

Figures 4, 5:
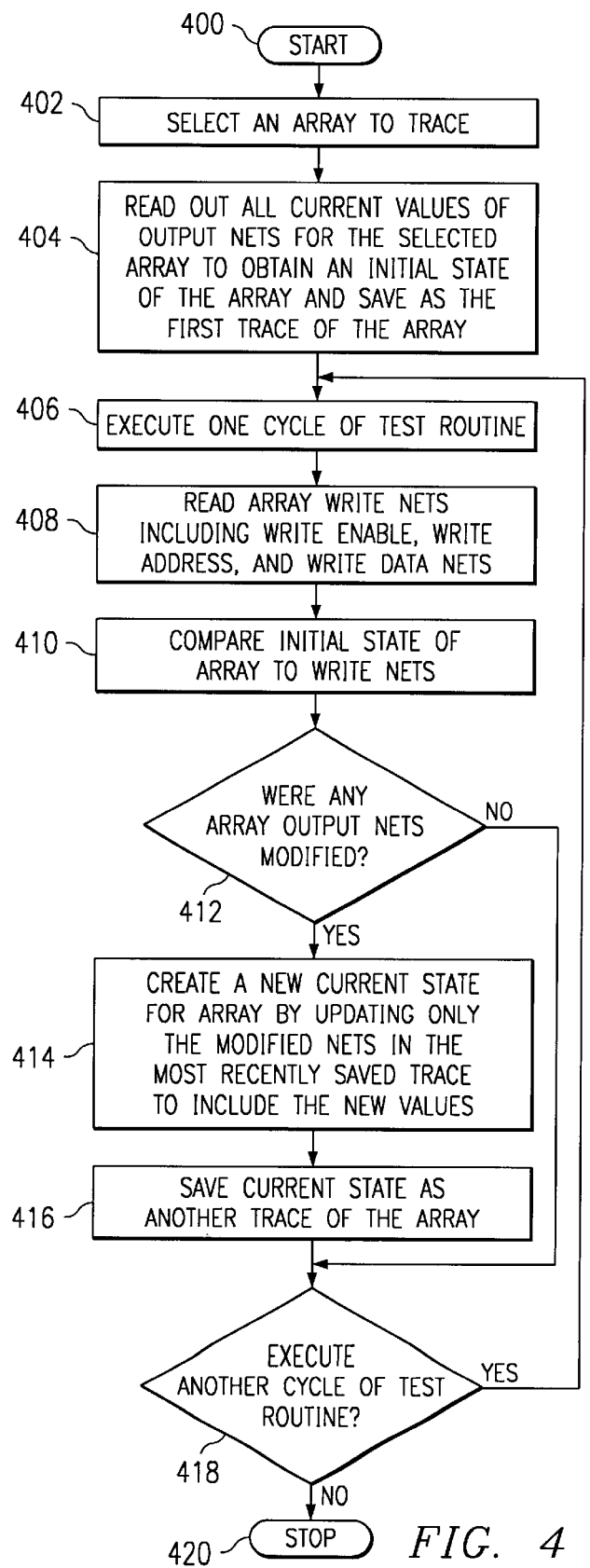
FIG. 4 illustrates a high level flow chart which illustrates creating a trace of an array during execution of a test routine by a logic simulator machine in accordance with the present invention.
FIG. 5 depicts an initial state of an array and a state of the array after execution of one cycle of a test routine in accordance with the present invention.

FIG. 4 illustrates a high level flow chart which illustrates creating a trace of an array during execution of a test routine by a logic simulator machine in accordance with the present invention. The process starts as depicted by block 400 and thereafter passes to block 402 which illustrates selecting an array to trace. Next, block 404 depicts reading all of the current values of the output nets for the selected array in order to obtain an initial state of the array. The initial state of the array is a copy of all of the data stored in the array prior to executing any more cycles of the test routine. Thereafter, block 406 illustrates executing one cycle of the test routine. Block 408, then, depicts reading all of the input write nets for the selected array. The input write nets include the write enable, write address, and write data nets. Next, block 410 illustrates a comparison of the input write nets for the array with the initial state saved forte array. Block 412, then, depicts a determination of whether or not any of the array output nets were modified from their initial state. An array output net having a particular address will be modified when the write enable input is set and write data is written to the particular address which is different from the original data. For example, if the array has an output net addressed by X, if the initial state of the net was a logical zero and a logical one was written to that address, the data has changed from its initial state. However, if the original data is a logical zero and a logical zero is again written to address, to data has not been modified even though the array was written to.

If a determination is made that none of the array output nets were modified, the process passes to block 418. Referring again to block 412, if a determination is made that at least one of the output nets was modified, the process passes to block 414 which illustrates determining a current state of the array by updating only the modified nets from the most recently saved trace. The current state of the array is the current value for each output net of the array. Thereafter, block 416 depicts saving the current state as another trace of the array. The new trace of the array will represent the current state of the array. Next, block 418 illustrates a determination of whether or not another cycle of the test routine is to be executed. If a determination is made that another cycle of the test routine is to be executed, the process passes back to block 406. Referring again to block 418, if a determination is made that another cycle of the test routine is not to be executed, the process terminates as depicted by block 420.

FIG. 5 depicts an initial state of an array and a state of the array after execution of one cycle of a test routine in accordance with the present invention. The initial state of the array is illustrated by array 500. Array 502 is the state of the same array after one cycle of the test program is executed. During execution of the cycle of the test program, the data stored at addresses 4 and 7 was modified. Other addresses may have also been written to during the execution of the cycle of the test routine, but the result was no change to the data. For example, during execution of the one cycle of the test routine, a logical one may have been written to address 1. However, because address 1 already had stored a logical one, the result is that address 1 was not modified.

In accordance with the present invention, an initial trace is stored which includes a copy of all of the data stored in array 500. Thereafter, when the next cycle of the test routine is executed, a new trace is generated. The new trace starts with a copy of the data of the most recently stored trace. Therefore, the next trace starts with the data of array 500. During this cycle of the test routine, the write control inputs, i.e. the write enable, write address, and write data inputs, are read to determine, first, which addresses were written to. The data in these addresses is then analyzed to determine whether the data was modified during this cycle. If the data was modified, the modified data is stored in this new trace. The other data from the most recently stored trace is not modified.

Array 502 is the state of the array after the execution of the cycle of the test routine. By comparing array 500 to array 502, it is clear that the storage locations of address 4 and address 7 were the only storage locations where data was modified during the cycle. Therefore, the most recently stored trace, which is the copy of the data of array 500, is stored as the new trace. Then, only the data of addresses 4 and 7 is updated in the trace. Thus, a new trace is stored which accurately reflects the state of the storage locations of array 502.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a logic simulator machine for creating a trace of an array which includes a plurality of storage locations, said logic simulator machine executing a test routine, said method comprising the steps of:

prior to executing said test routine, storing an initial copy of all data included within each of said plurality of storage locations of said array as a first trace of said array;

during execution of a first cycle of said test routine, reading all write control inputs into said array to identify ones of said plurality of storage locations which were modified during said first cycle, wherein the step of reading all write control inputs comprises reading a write enable input, a write address input, and a write data input into said array to identify ones of said plurality of storage locations which were modified during said first cycle; and generating a new trace of said array, wherein said new trace is generated by updating only ones of said plurality of storage locations which were modified during execution of a cycle of said test routine.

2. The method according to claim 1, further comprising the steps of:

during each subsequent execution of a cycle of said test routine, reading all write control inputs into said array to identify ones of said plurality of storage locations which were modified during each subsequent cycle of said test routine; and generating another new trace of said array after each subsequent cycle of said test routine by storing a copy of a most recently generated trace and updating only said ones of said plurality of storage locations included in said most recently generated trace which were modified during said subsequent cycle of said test routine.

3. The method according to claim 1, further comprising the steps of:

comparing said initial copy of all data included within each of said plurality of storage locations to said write control inputs;

determining whether any of said storage locations were written to during said execution of said each cycle of said test routine;

for each of said storage locations which were written to, determining whether data stored in said each of said storage locations was changed; and in response to the determination that said data stored in said each of said storage locations was changed, generating said new trace of said array including a copy of all of said first trace and updating only said each of said storage locations which included data which was changed.

4. A logic simulator machine for creating a trace of an array which includes a plurality of storage locations, said logic simulator machine executing a test routine, comprising:

an initial copy of all data included within each of said plurality of storage locations of said array stored prior to executing said test routine as a first trace of said array;

during execution of a first cycle of said test routine, means for reading all write control inputs into said array to identify ones of said plurality of storage locations which were modified during said first cycle, wherein the means for reading all write control inputs comprises means for reading a write enable input, a write address input, and a write data input into said array to identify ones of said plurality of storage locations which were modified during said first cycle; and a new trace of said array generated, wherein said new trace is generated by updating only ones of said plurality of storage locations which were modified during execution of a cycle of said test routine.

5. The logic simulator machine according to claim 4, further comprising:

during each subsequent execution of a cycle of said test routine, means for reading all write control inputs into said array to identify ones of said plurality of storage locations which were modified during each subsequent cycle of said test routine; and another new trace of said array is generated after each subsequent cycle of said test routine by storing a copy of a most recently generated trace and updating only said ones of said plurality of storage locations included in said most recently generated trace which were modified during said subsequent cycle of said test routine.

6. The logic simulator machine according to claim 4, further comprising:

means for comparing said initial copy of all data included within each of said plurality of storage locations to said write control inputs;

means for determining whether any of said storage locations were written to during said execution of said each cycle of said test routine;

for each of said storage locations which were written to, means for determining whether data stored in said each of said storage locations was changed; and in response to the determination that said data stored in said each of said storage locations was changed, said new trace is generated of said array including a copy of all of said first trace and updating only said each of said storage locations which included data which was changed.

* * * * *